US012655516B2

(12) United States Patent
Austin et al.

(10) Patent No.: US 12,655,516 B2
(45) Date of Patent: Jun. 16, 2026

(54) SEAM MITIGATION AND INTEGRATED LINER FOR GAP FILL

(71) Applicant: Lam Research Corporation, Fremont, CA (US)

(72) Inventors: Dustin Zachary Austin, Tigard, OR (US); Ian John Curtin, Portland, OR (US); Joseph R. Abel, West Linn, OR (US); Bart J. Van Schravendijk, Palo Alto, CA (US); Seshasayee Varadarajan, Lake Oswego, OR (US); Adrien Lavoie, Newberg, OR (US); Jeremy David Fields, Portland, OR (US); Pulkit Agarwal, Beaverton, OR (US); Shiva Sharan Bhandari, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 655 days.

(21) Appl. No.: 17/995,292

(22) PCT Filed: Mar. 31, 2021

(86) PCT No.: PCT/US2021/025271
§ 371 (c)(1),
(2) Date: Sep. 30, 2022

(87) PCT Pub. No.: WO2021/202808
PCT Pub. Date: Oct. 7, 2021

(65) Prior Publication Data
US 2023/0175117 A1 Jun. 8, 2023

Related U.S. Application Data

(60) Provisional application No. 63/003,671, filed on Apr. 1, 2020.

(51) Int. Cl.
*C23C 16/04* (2006.01)
*C23C 16/32* (2006.01)
(Continued)

(52) U.S. Cl.
CPC .......... *C23C 16/045* (2013.01); *C23C 16/325* (2013.01); *C23C 16/345* (2013.01); *C23C 16/401* (2013.01); *C23C 16/45542* (2013.01)

(58) Field of Classification Search
CPC ......... H01L 21/02323; H01L 21/02164; H01L 21/0217; C23C 16/45523;
(Continued)

(56) References Cited

U.S. PATENT DOCUMENTS 5,614,270 A * 3/1997 Yeh ..................... H01L 21/3105
427/535
6,265,321 B1 7/2001 Chooi et al.
(Continued)

FOREIGN PATENT DOCUMENTS

CN 1943023 A 4/2007
JP 2003264170 A 9/2003
(Continued)

OTHER PUBLICATIONS

International Preliminary Report on Patentability and Written Opinion dated Aug. 29, 2024 in PCT Application No. PCT/US2023/062571.
(Continued)

*Primary Examiner* — Joseph A Miller, Jr.
(74) *Attorney, Agent, or Firm* — Weaver Austin Villeneuve & Sampson LLP

(57) ABSTRACT

Methods of filling a gap with a dielectric material including using an inhibitor plasma during deposition. The inhibitor plasma increases a nucleation barrier of the deposited film. When the inhibitor plasma interacts with material in the
(Continued)

Incoming structure with polySi

Deposit Protective Liner

Gapfill

Gapfill feature, the material at the bottom of the feature receives less plasma treatment than material located closer to a top portion of the feature or in field. Deposition at the top of the feature is then selectively inhibited and deposition in lower portions of the feature proceeds with less inhibition or without being inhibited. As a result, bottom-up fill is enhanced, which can create a sloped profile that mitigates the seam effect and prevents void formation. In some embodiments, an underlying material at the top of the feature is protected using an integrated liner. In some embodiments, a hydrogen chemistry is used during gap fill to reduce seam formation.

16 Claims, 10 Drawing Sheets

(51) Int. Cl.
| | |
|---|---|
| *C23C 16/34* | (2006.01) |
| *C23C 16/40* | (2006.01) |
| *C23C 16/455* | (2006.01) |

(58) Field of Classification Search
CPC .............. C23C 16/45542; C23C 16/02; H10P 14/6336; H10P 14/61; H10P 14/6532; H10P 14/6339
See application file for complete search history.

(56) References Cited

U.S. PATENT DOCUMENTS

| | | | |
|---|---|---|---|
| 6,391,147 | B2 | 5/2002 | Imafuku et al. |
| 7,524,750 | B2 | 4/2009 | Nemani et al. |
| 7,939,419 | B2 | 5/2011 | Lee |
| 9,159,606 | B1 | 10/2015 | Purayath et al. |
| 9,230,983 | B1 | 1/2016 | Sharangpani et al. |
| 9,349,687 | B1 | 5/2016 | Gates et al. |
| 9,385,028 | B2 | 7/2016 | Nemani et al. |
| 9,396,989 | B2 | 7/2016 | Purayath et al. |
| 9,425,078 | B2 | 8/2016 | Tang et al. |
| 9,773,643 | B1 | 9/2017 | Singhal et al. |
| 9,978,610 | B2 | 5/2018 | Fung et al. |
| 10,037,884 | B2 | 7/2018 | Ou et al. |
| 10,096,514 | B2 | 10/2018 | Anthis et al. |
| 10,373,806 | B2 | 8/2019 | Singhal et al. |
| 10,395,944 | B2 | 8/2019 | Fung et al. |
| 10,643,846 | B2 | 5/2020 | Smith et al. |
| 10,763,108 | B2 | 9/2020 | Hausmann et al. |
| 11,293,098 | B2 | 4/2022 | Abel et al. |
| 2001/0051423 | A1 | 12/2001 | Kim et al. |
| 2007/0243693 | A1 | 10/2007 | Nemani et al. |
| 2008/0179715 | A1 | 7/2008 | Coppa |
| 2008/0182382 | A1 | 7/2008 | Ingle et al. |
| 2009/0137094 | A1 | 5/2009 | Lee |
| 2015/0104955 | A1* | 4/2015 | Pore .................. C23C 16/45523 438/791 |
| 2015/0206719 | A1 | 7/2015 | Swaminathan et al. |
| 2015/0217330 | A1 | 8/2015 | Haukka et al. |
| 2015/0243545 | A1 | 8/2015 | Tang et al. |
| 2015/0303069 | A1 | 10/2015 | Narishige et al. |
| 2016/0042968 | A1 | 2/2016 | Purayath et al. |
| 2016/0163557 | A1 | 6/2016 | Hudson et al. |
| 2016/0163711 | A1 | 6/2016 | Arndt et al. |
| 2016/0293398 | A1 | 10/2016 | Danek et al. |
| 2017/0053811 | A1 | 2/2017 | Fung et al. |
| 2017/0107621 | A1 | 4/2017 | Suemori |
| 2017/0114459 | A1* | 4/2017 | Saly ..................... C23C 16/345 |
| 2017/0250068 | A1 | 8/2017 | Ishikawa et al. |
| 2018/0005801 | A1 | 1/2018 | Singhal et al. |
| 2018/0033606 | A1 | 2/2018 | Pore et al. |
| 2018/0033689 | A1 | 2/2018 | Anthis et al. |
| 2018/0047615 | A1 | 2/2018 | Cheng et al. |
| 2018/0061628 | A1* | 3/2018 | Ou .......................... H01L 21/32 |
| 2018/0061663 | A1 | 3/2018 | Chandrashekar et al. |
| 2018/0182777 | A1 | 6/2018 | Cui et al. |
| 2018/0294166 | A1 | 10/2018 | Mallick et al. |
| 2019/0057858 | A1 | 2/2019 | Hausmann et al. |
| 2019/0103278 | A1* | 4/2019 | Hung ...................... C23C 16/42 |
| 2019/0172723 | A1 | 6/2019 | Cheng et al. |
| 2019/0284697 | A1 | 9/2019 | Tonari |
| 2020/0017967 | A1 | 1/2020 | Abel et al. |
| 2020/0090945 | A1 | 3/2020 | Dole et al. |
| 2020/0243330 | A1 | 7/2020 | Kubo et al. |
| 2020/0318236 | A1 | 10/2020 | Arkles et al. |
| 2020/0357636 | A1 | 11/2020 | Abel et al. |
| 2021/0125832 | A1 | 4/2021 | Bhatnagar |
| 2021/0313167 | A1 | 10/2021 | Pore et al. |
| 2021/0395888 | A1 | 12/2021 | Cho et al. |
| 2021/0398780 | A1 | 12/2021 | Lavoie et al. |
| 2022/0005693 | A1 | 1/2022 | Mizoguchi et al. |
| 2022/0037146 | A1 | 2/2022 | Abel et al. |
| 2023/0307290 | A1 | 9/2023 | Abel et al. |
| 2025/0054752 | A1 | 2/2025 | Austin et al. |
| 2025/0062118 | A1 | 2/2025 | Austin et al. |
| 2025/0154644 | A1 | 5/2025 | Jeon et al. |
| 2025/0179632 | A1 | 6/2025 | Zhang et al. |
| 2025/0250666 | A1 | 8/2025 | Messina et al. |

FOREIGN PATENT DOCUMENTS

| | | |
|---|---|---|
| JP | 2008166726 A | 7/2008 |
| JP | 2013026347 A | 2/2013 |
| KR | 20080050510 A | 6/2008 |
| KR | 20160061885 A | 6/2016 |
| KR | 20160118968 A | 10/2016 |
| TW | 200802605 A | 1/2008 |
| TW | 201419400 A | 5/2014 |
| WO | WO-2020009818 A1 | 1/2020 |
| WO | WO-2021076636 A1 | 4/2021 |
| WO | WO-2021202808 A1 | 10/2021 |

OTHER PUBLICATIONS

International Preliminary Report on Patentability and Written Opinion dated Jun. 27, 2024 in PCT Application No. PCT/US2022/081591.

International Preliminary Report on Patentability and Written Opinion dated Jun. 27, 2024 in PCT Application No. PCT/US2022/081636.

International Preliminary Report on Patentability and Written Opinion dated Oct. 31, 2024 in PCT Application No. PCT/US2023/019167.

International Preliminary Report on Patentability and Written Opinion dated Sep. 12, 2024 in PCT Application No. PCT/US2023/063389.

International Search Report and Written Opinion dated Apr. 25, 2023 in PCT Application No. PCT/US2022/081591.

International Search Report and Written Opinion dated Apr. 25, 2023 in PCT Application No. PCT/US2022/081636.

International Search Report and Written Opinion dated Aug. 7, 2023 in PCT Application No. PCT/US2023/019167.

International Search Report and Written Opinion dated Jun. 8, 2023 in PCT Application No. PCT/US2023/062571.

International Search Report and Written Opinion dated Jun. 15, 2023, in Application No. PCT/US2023/063389.

KR Office Action dated Apr. 14, 2025 in KR Application No. 10-2022-7038167, with English Translation.

TW Office Action and Search Report dated Mar. 13, 2025 in TW Application No. 110123723, with English Translation.

TW Office Action dated Oct. 15, 2024 in TW Application No. 110111860 with English translation.

U.S. Notice of Allowance dated May 7, 2025 in U.S. Appl. No. 18/003,145.

U.S. Appl. No. 18/842,017, inventors Zhang T, et al., filed on Aug. 27, 2024.

U.S. Appl. No. 18/856,864, inventors Messina D.C et al., filed on Oct. 14, 2024.

(56)        References Cited

OTHER PUBLICATIONS

International Preliminary Report on Patentability dated Jan. 12, 2023, in PCT Application No. PCT/US2021/039444.

International Preliminary Report on Patentability dated Oct. 13, 2022, in PCT Application No. PCT/US2021/025271.

International Search Report and Written Opinion dated Oct. 21, 2021, in application No. PCT/US2021/039444.

U.S. Advisory Action dated Feb. 16, 2021 in U.S. Appl. No. 16/032,176.

U.S. Advisory Action dated May 19, 2020 in U.S. Appl. No. 16/032,176.

U.S. Final Office Action dated Dec. 9, 2020 in U.S. Appl. No. 16/032,176.

U.S. Final Office Action dated Mar. 11, 2020 in U.S. Appl. No. 16/032,176.

U.S. Non-Final Office Action dated Aug. 4, 2021 in U.S. Appl. No. 16/032,176.

U.S. Non-Final Office Action dated Jun. 25, 2020 in U.S. Appl. No. 16/032,176.

U.S. Non-Final Office Action dated Oct. 3, 2019 in U.S. Appl. No. 16/032,176.

U.S. Notice of Allowance dated Apr. 3, 2024 in U.S. Appl. No. 17/696,276.

U.S. Notice of Allowance dated Dec. 6, 2022 in U.S. Appl. No. 16/032,176.

U.S. Notice of Allowance dated May 3, 2024 in U.S. Appl. No. 17/696,276.

U.S. Restriction Requirement dated Jul. 8, 2019 in U.S. Appl. No. 16/032,176.

JP Office Action dated Jul. 1, 2025 in JP Application No. 2022-581361, with English Translation.

U.S. Non-Final Office Action dated Mar. 27, 2025 in U.S. Appl. No. 18/577,681.

U.S. Notice of Allowance dated Aug. 5, 2025 in U.S. Appl. No. 18/577,681.

KR Office Action dated Dec. 24, 2025 in KR Application No. 1020227038167, with English Translation.

KR Office Action dated Nov. 11, 2025 in KR Application No. 10-2022-7046062, with English Translation.

U.S. Restriction Requirement dated Dec. 18, 2025 in U.S. Appl. No. 18/856,864.

KR Office Action dated Mar. 29, 2026 in KR Application No. 10-2024-7023684, with English Translation.

TW Office Action and Search Report dated Apr. 1, 2026 in TW Application No. 111148183, with English Translation.

U.S. Non-Final Office Action dated Apr. 9, 2026 in U.S. Appl. No. 18/856,864.

* cited by examiner

Expose substrate to silicon precursor
402

Optionally purge chamber
404

Expose substrate to plasma generated from co-reactant
406

Optionally purge chamber
408

SEAM MITIGATION AND INTEGRATED LINER FOR GAP FILL

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Many semiconductor device fabrication processes involve forming dielectric films such as silicon oxide. Depositing a high-quality film can be particularly challenging when depositing films in gaps. Challenges can include the formation of voids and/or seams in the films.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclose relates to a method comprising providing a substrate having structure including a gap to be filled; depositing a protective liner selectively at an upper portion of the structure such that it extends only partially into the gap; and performing one or more cycles of: (a) exposing the substrate to a plasma comprising halogen species to inhibit deposition on a portion of the gap; (b) after (a), depositing dielectric material in the gap.

In some embodiments, the protective liner is a silicon-containing film.

In some embodiments, the protective liner is an oxide, nitride, or carbide.

In some embodiments, the protective liner is etched during (a).

In some embodiments, the plasma during (a) is generated from nitrogen trifluoride ($NF_3$) and the protective liner is a silicon nitride film.

In some embodiments, the protective liner is between 10 and 999 Angstroms thick.

In some embodiments, depositing a protective liner and the performing one or more cycles are performed in the same chamber.

In some embodiments, the structure is a 3D NAND structure, the gap is formed by two stacks each comprising multiple pairs of an oxide layer and a nitride layer and capped by a polysilicon layer and wherein the protective liner protects the polysilicon layer.

In some embodiments, depositing the protective liner comprises a plasma enhanced atomic layer deposition (ALD) process.

In some such embodiments, the plasma power during the ALD process is lower than plasma power during (a).

In some embodiments, depositing the protective liner comprises a plasma enhanced chemical vapor deposition (PECVD) process.

Another aspect of the disclosure relates to a method comprising providing a substrate having structure including a gap to be filled, the gap lined with a protective liner that extends only partially into the gap; and performing one or more cycles of: (c) exposing the substrate to a plasma comprising halogen species to inhibit deposition on a portion of the gap; (d) after (a), depositing dielectric material in the gap.

Another aspect of the disclosure relates to a method comprising: providing a structure comprising a gap to be filled; performing one or more inhibition blocks, each inhibition block comprising: one or more growth cycles, each growth cycle comprising: exposing the gap to a halogen-containing inhibition plasma and depositing by atomic layer deposition a dielectric material in the gap; after the one or more growth cycles, exposing the structure to a plasma generated from a hydrogen-containing gas; after exposing the structure to the plasma generated from a hydrogen-containing gas, exposing the structure to an oxidizing plasma.

These and other aspects of the disclosure are discussed further below with reference to the drawings.

DETAILED DESCRIPTION

Figure 1:
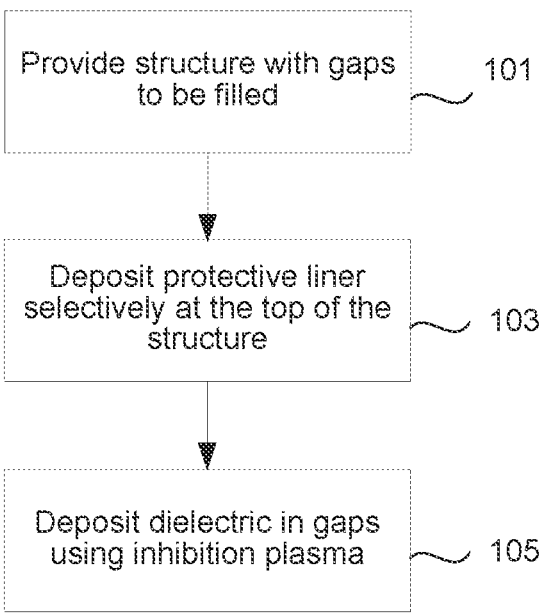
FIG. 1 is a process flow diagram depicting operations for a method in accordance with disclosed embodiments.

In the following description, numerous specific details are set forth to provide a thorough understanding of the presented embodiments. The disclosed embodiments may be practiced without some or all these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often include dielectric gap fill using chemical vapor deposition (CVD) and/or atomic layer deposition (ALD) methods to fill features. Described herein are methods of filling features with dielectric material including but not limited to silicon-containing films such as silicon oxide, and related systems and apparatuses. The methods described herein can be used to fill vertically oriented features formed in a substrate. Such features may be referred to as gaps, recessed features, negative features, unfilled features, or simply features. Filling such features may be referred to as gapfill. Features formed in a substrate can be characterized by one or more of narrow and/or re-entrant openings, constrictions within the feature, and high aspect ratios. In some implementations, a feature may have an aspect ratio of at least about 2:1, at least about 4:1, at least about 6:1, at least about 20:1, at least about 100:1, or greater. The substrate may be a silicon wafer, e.g., a 200-mm wafer, a 300-mm wafer, or a 450-mm wafer, including wafers having one or more layers of material such as dielectric, conducting, or semi-conducting material deposited thereon.

One aspect of the disclosure relates to a method of using an inhibitor plasma during atomic layer deposition (ALD) of dielectric material in gaps that facilitates void-free bottom gapfill. The inhibitor plasma creates a passivated surface and increases a nucleation barrier of the deposited ALD film. When the inhibitor plasma interacts with material in the feature, the material at the bottom of the feature receives less plasma treatment than material located closer to a top portion of the feature or in field because of geometrical shadowing effects. As a result, deposition at the top of the feature is selectively inhibited and deposition in lower portions of the feature proceeds with less inhibition or without being inhibited. As a result, bottom-up fill is enhanced, which creates a more favorable sloped profile that mitigates the seam effect and prevents void formation. Halogen-containing plasmas can be effective inhibition plasmas. For example, for some applications, a plasma generated from nitrogen trifluoride ($NF_3$) may provide an inhibition effect in a substantially reduced time compared to a plasma generated from molecular nitrogen ($N_2$). However, halogen-containing plasmas may also act as an etchant. For example, while performing an inhibition, an atom hitting a surface with low energy can act as an inhibitor while a high energy atom can remove material. Because the plasma has an energy distribution, some component of the plasma may hit near the top of the feature and etch. Any dielectric etched is replaced during deposition. If underlying material (e.g., polysilicon (poly Si), a metal oxide, etc.) is removed, it is not replaced and can affect device performance. Described herein are methods of protecting the underlying material by depositing an integrated liner.

FIG. 1 is a process flow diagram that illustrates a method of filling gaps with dielectric material without damaging underlying layers. The method begins with providing a structure with one or more gaps to be filled. Block 101. The structure may be formed by one or more layers of material deposited on a substrate. The substrate may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to for gapfill other substrates, such as glass, plastic, and the like, including in the fabrication of microelectromechanical (MEMS) devices.

Examples of structures include 3D NAND structures, DRAM structures, and shallow trench isolation (STI) structures. The structures include gaps with the sidewalls of the gaps formed by a material susceptible to etch. In one example, 3D NAND structure includes oxide-nitride-oxide-nitride (ONON) stacks covered with a poly Si layer. Left unprotected, the poly Si layer is susceptible to etch. Other examples of sidewall materials include oxides, metals, and semiconducting materials. The methods described herein are not limited to a particular class of sidewall material and can protect any susceptible material. The structure may be provided to a deposition chamber for deposition of a protective liner. The deposition chamber may be the same chamber as the subsequent dielectric deposition or a different chamber.

FIG. 2 shows an example of a structure 200 during various stages of a gap fill method described herein. At 201, the structure 200 is shown with gaps 206 to be filled with a dielectric material. In the example of FIG. 2, the gaps 206 are formed between ONON stacks covered with a polySi layer 208, which forms the sidewalls of the gaps 206.

Returning to FIG. 1, a protective liner is deposited selectively at the top of the gaps. Block 103. The protective liner is a layer that protects the underlying layer from unwanted etch during a subsequent inhibition plasma. It is deposited selectively at the top of the gaps where etching occurs during the inhibition. In this manner, it protects the underlying the layer from etching and is removed during the inhibition operations. In some embodiments, it may be deposited no more than 50%, 40%, 30%, 20%, or 10% into the gap depth. In alternate embodiments, it can be deposited deeper into the gap, including as a conformal layer lining the gap. In such embodiments, at least part of the protective liner may remain in the filled gaps.

The protective liner may be formed from a material that is relatively etch resistant to the inhibition plasma. Examples of protective liners include silicon nitrides, silicon carbides, and silicon oxides (including silicon oxynitrides, silicon oxycarbides, silicon carbon nitrides, etc.). Any material may be used that is compatible with the inhibitor gas and has a high selectivity (low etch rate) in the inhibitor compared to the underlying film. Non silicon-containing nitrides, carbides, and oxides may be deposited in some embodiments. Examples include titanium oxide, zirconium oxide, tin oxide, and hafnium oxide. The protective film material may be also be chosen for its compatibility with the gap fill material in embodiments in which it is not completely removed. In some embodiments, a carbide may be used as they may have relatively higher etch resistance in halogen-based plasmas compared to nitrides and oxides.

In many embodiments, the material is sacrificial and removed during inhibition and so not particularly limited. The depth of protective liner is determined by determining the depth that the inhibition plasma damages the underlying layer in the absence of the protective liner. This may be done experimentally, by modelling, or a combination of these. The protective liner may be deposited to a thickness such that it will protect the underlying layer through the inhibition plasmas but be removed by the end of the last inhibition plasma. This can be determined experimentally and/or from known etch rates. Example thicknesses may range from tens to hundreds of Angstroms. In some embodiments, some amount of protective liner may remain after gap fill. In such cases, a separate removal process may be implemented prior to filling the portion of the gap where the protective liner remains. In some embodiments, the protective liner may be left in the device.

Deposition of the protective liner by atomic layer deposition (ALD) can result in the thickness tapering down from the top of the gap to its deepest point. Etch rates decrease with increasing depth such that a tapered protective liner may be removed without etching the underlying layer. At 201, a structure 200 including gaps 206 and poly Si layer 208 is shown. At 203 in FIG. 2A, a protective liner 210 is shown on the poly Si layer 208. The protective liner is deposited selectively at an upper portion of the structure such that it extends only partially into the gap along the sidewall. As discussed above, the thickness of the protective liner 210 may taper, becoming thinner as the depth increases (not shown).

Deposition of a protective liner is described further below with respect to FIGS. 4A and 4B. Returning to FIG. 1, once the protective liner is deposited, a dielectric material is deposited in the gaps using an inhibition plasma. Block 105.

As discussed further below, this can involve cycles of inhibition plasma followed by ALD of the dielectric film. The protective liner protects the sidewalls of the top of the gap during the inhibition plasma. In alternate embodiments, a protective liner may be used in other processes in which a structure is exposed to a plasma that may be have an etching component. In some embodiments, it may be useful to deposit a protective liner at some point during the fill of the gap. For example, if the protective material is etched away, more protective material may be re-deposited. In other embodiments, the gap fill may proceed without another protective liner deposition.

Figure 2A:
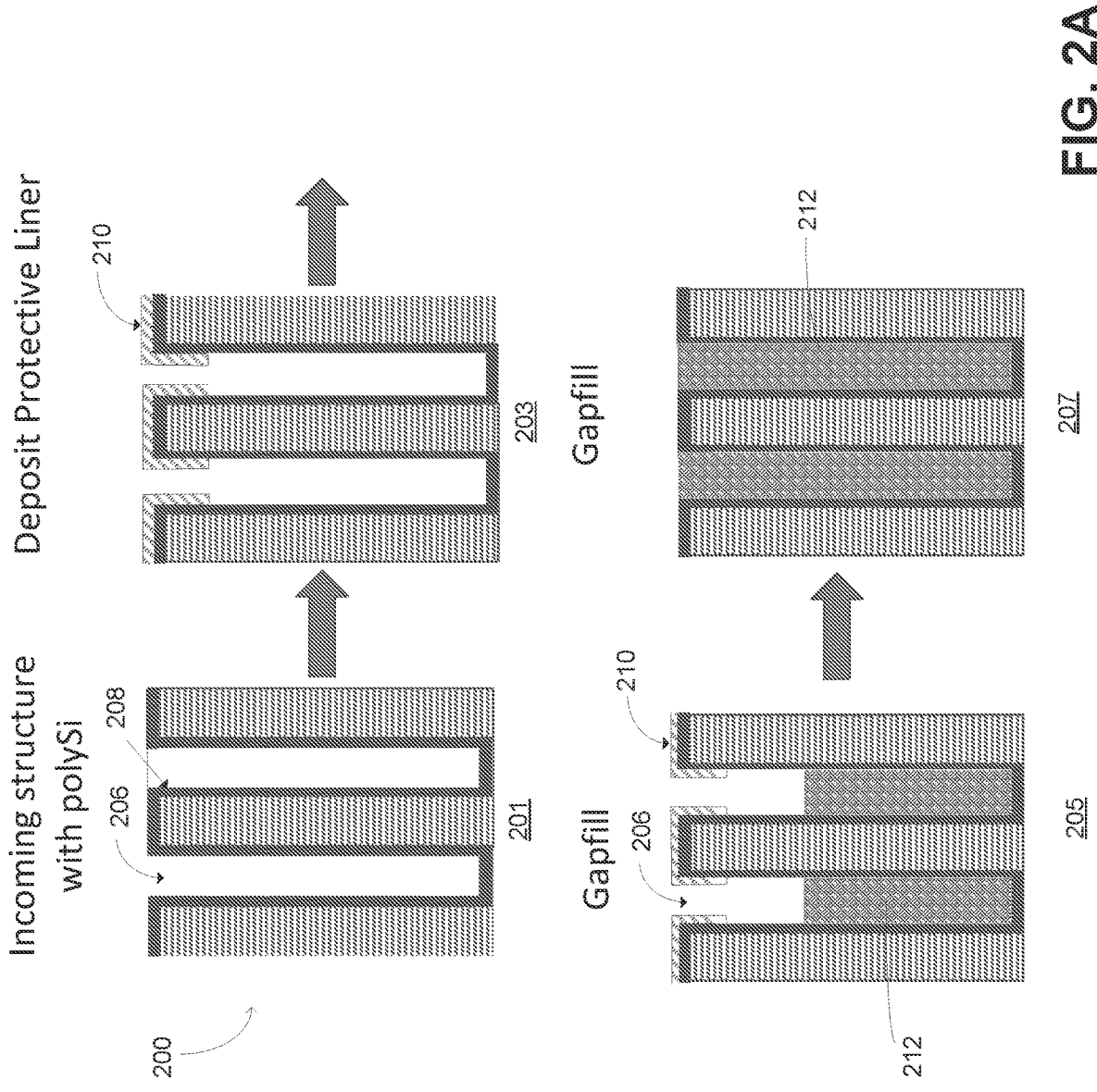
FIGS. 2A and 2B show illustrations of an example of filling gaps in accordance with disclosed embodiments.

In FIG. 2A, at 205, the gaps are partially filled with a dielectric material 212. At this stage, the protective liner 210 is still present, though thinner than at 205, having been partially etched by the inhibition plasma. The gaps 206 are filled with dielectric material 212 in a bottom-up manner, such that there is relatively little or no deposition on the poly Si sidewalls above the fill line. This is due to the inhibition plasma. At 207, the gaps are filled with dielectric material 212 with the protective liner 210 removed and the poly Si layer 208 intact. According to various embodiments, some amount of protective liner may be present (e.g., on the order of ones or tens of nanometers) and/or some etching of the underlying layer may occur.

Figure 2B:
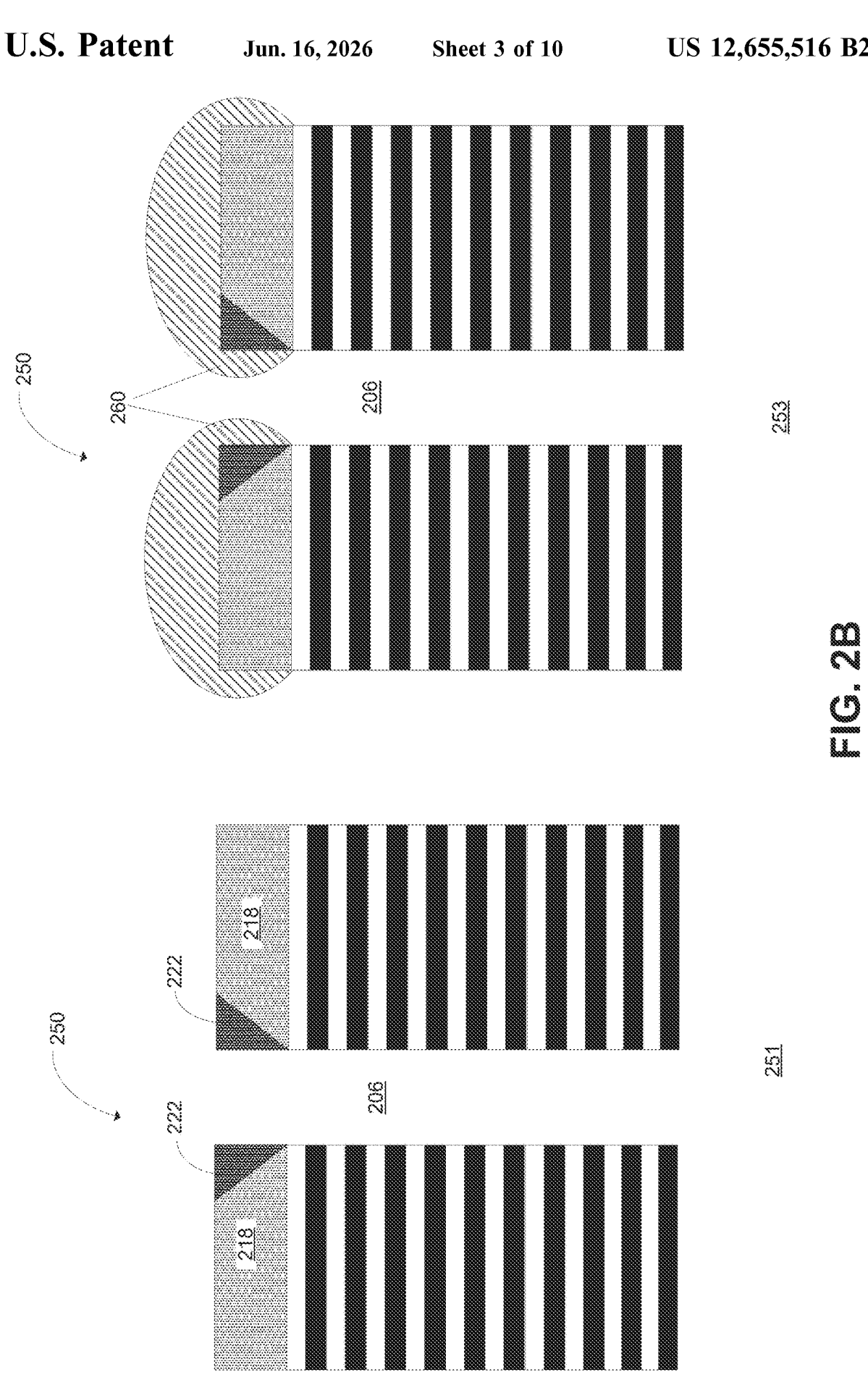

Deposition protective liner by chemical vapor deposition (CVD) may be useful to protect the tops of structures. In FIG. 2B, at 251, an example of a 3D NAND structure 250 with poly Si 218 at the top of an ONON stack is shown. The poly Si 218 is particularly vulnerable at region 222 during an inhibition plasma used to fill the gap 206. The top and other exposed regions of the poly Si 218 may also be vulnerable. At 253, a protective liner 260 is shown. As compared to the protective liner in FIG. 2A, protective liner 260 in FIG. 2B is much less conformal and selectively deposited at the top of the structure 250 to protect the poly Si 218 including region 222 with significantly less or no deposition on the sidewalls below poly Si. As described further below, it may be deposited by a CVD method such as plasma enhanced CVD (PECVD). In some embodiments, the bulk of the non-conformal protective liner 260 may extend less than about 10% or 20% of the gap 206. In one example, the poly Si at the top of the 3D NAND structure may be about 100-500 nanometers, or 100-300 nanometers, or about 200 nanometers. The bulk of the non-conformal protective liner 260 may extend about 100-500 nanometers, or 100-300 nanometers, or about 200 nanometers to protect it.

Figure 3:
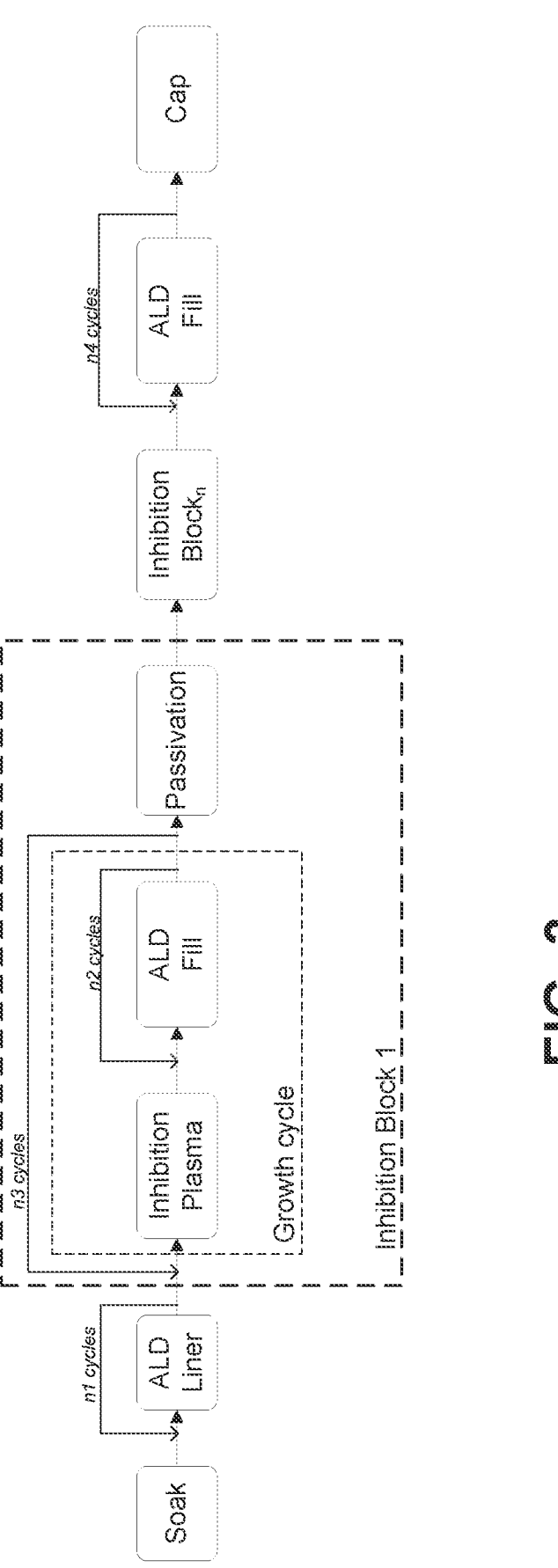
FIG. 3 shows an example of a process sequence that may be used in accordance with the disclosed embodiments.

FIG. 3 shows an example of a process sequence that may be used in accordance with the disclosed embodiments. The process sequence in FIG. 3 include deposition of a protective liner prior to exposure to an inhibition plasma. Other operations (e.g., soak, passivation) may be omitted in certain embodiments and operations may be added in certain embodiments. In the example process sequence of FIG. 3, one or more wafers undergo gap fill. The process may begin with a soak after being provided to a deposition chamber. This can be useful, for example, to remove particles or other pretreatment. Then, n1 cycles of ALD deposition of protective liner are performed. Further details of the protective liner ALD are discussed below. After the protective liner is deposited, n inhibition blocks are performed, with the operations of the first inhibition block (n=1) shown. The first operation is the inhibition plasma, which is a surface treatment. As discussed above, the plasma may include halogen species including anion and radical species such as F⁻, Cl⁻, I⁻, Br⁻, fluorine radicals, etc. Other inhibition plasmas may be used, with a protective liner providing protection from any plasma that can damage a structure. For example, plasmas generated from molecular nitrogen ($N_2$), molecular hydrogen ($H_2$), ammonia ($NH_3$), amines, diols, diamines, aminoalcohols, thiols or combinations thereof may be used as inhibition plasmas. If conditions such as temperature, RF power, and sensitivity of the underlying material are such that plasma damage may occur with these, the protective liner may be used.

In alternate embodiments, a non-conformal liner as described with reference to FIG. 2B may be deposited using CVD. In such embodiments, the ALD liner is replaced with a CVD liner. As described further below, the CVD process is not a cyclic process.

When the inhibitor plasma interacts with material in the feature, the material at the bottom of the feature receives less plasma treatment than material located closer to a top portion of the feature or in field because of geometrical shadowing effects. As a result, deposition at the top of the feature is selectively inhibited and deposition in lower portions of the feature proceeds with less inhibition or without being inhibited. In FIG. 3, the next operation in the inhibition block is n2 cycles of ALD fill. The dielectric material is deposited selectively at the bottom of the feature. The inhibition plasma and the n2 cycles of ALD fill together make a growth cycle. This can be repeated n3 times to continue filling the feature with intermittent inhibition operations when the inhibition effect diminishes. The number of growth cycles in an inhibition block may depend on the re-entrancy of the feature, i.e., if it narrows at one or more points from the bottom to the top of the feature. Features that exhibit more re-entrancy may use a longer inhibition time or multiple inhibition blocks. In the example of FIG. 3, the inhibition block ends with a passivation operation. This is a surface treatment that removes residual inhibitor and can also densify the deposited film. In some embodiments, an oxygen plasma is used.

One or more additional inhibition blocks, including growth cycle and passivation, may be performed for a total of n inhibition blocks. The number of inhibition blocks depends on how much material is used to fill the feature. Inhibition plasma, ALD, and passivation conditions may be changed from inhibition block to inhibition block to fill the feature. For example, an inhibition plasma duration may be 20 seconds until the bottom quarter of the feature is filled (inhibition block 1), then changed to 5 seconds for the middle 50% of the structure (inhibition block 2), etc.

When the feature is nearly filled, inhibition may no longer be necessary, and the fill can be completed with n4 cycles of ALD fill. In some embodiments, a cap or overburden layer of dielectric may then be deposited. Plasma enhanced chemical vapor deposition (PECVD) may be used at this stage for a fast deposition.

In some embodiments, a protective liner may be re-deposited one or more times by ALD or CVD as described above at an appropriate place in the process of FIG. 3.

ALD is a technique that sequentially deposits thin layers of material. ALD processes use surface-mediated deposition reactions to deposit films on a layer-by-layer basis in cycles. The concept of an ALD "cycle" is relevant to the discussion of various embodiments herein. Generally, a cycle is the minimum set of operations used to perform a surface deposition reaction one time. The result of one cycle is the production of at least a partial silicon-containing film layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations.

As an example, an ALD cycle may include the following operations: (i) delivery/adsorption of a precursor, (ii) purging of the precursor from the chamber, (iii) delivery of a second reactant and optional plasma ignition, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

In one example of an ALD process, a substrate surface that includes a population of surface-active sites is exposed to a gas phase distribution of a first precursor, such as a silicon-containing precursor, in a dose provided to a chamber housing the substrate. Molecules of this first precursor are adsorbed onto the substrate surface, including chemisorbed species and/or physisorbed molecules of the first precursor. When a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas or nitrogen-containing gas, is introduced to the chamber so that some of these molecules react with the first precursor adsorbed on the surface. In some processes, the second reactant reacts immediately with the adsorbed first precursor. In other embodiments, the second reactant reacts only if a source of activation such as plasma is applied temporally. The chamber may then be evacuated again to remove unbound second reactant molecules. As described above, in some embodiments the chamber may not be completely evacuated. Additional ALD cycles may be used to build film thickness.

Figure 4A:
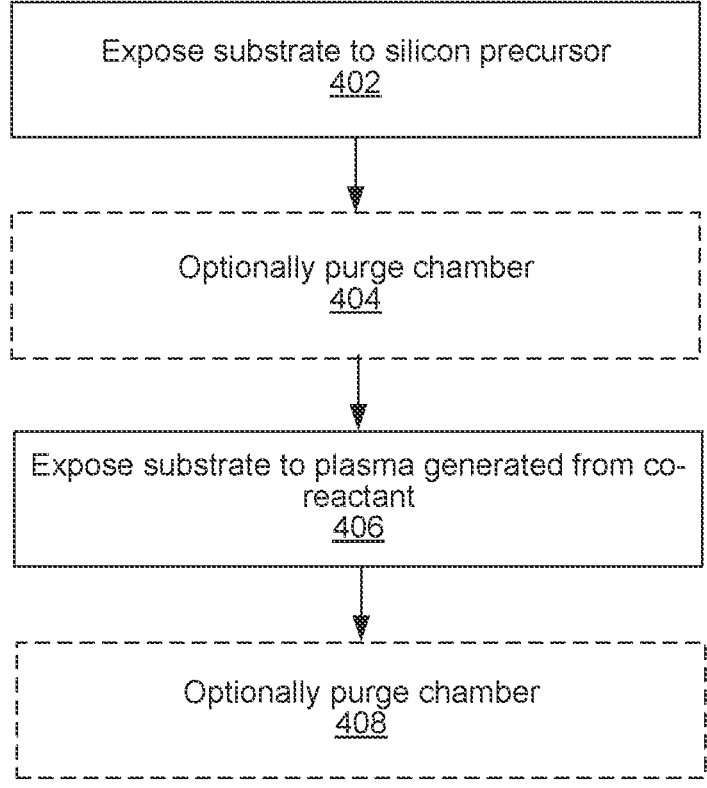
FIGS. 4A and 4B are process flow diagrams depicting operations for a method in accordance with disclosed embodiments.
Figure 4B:
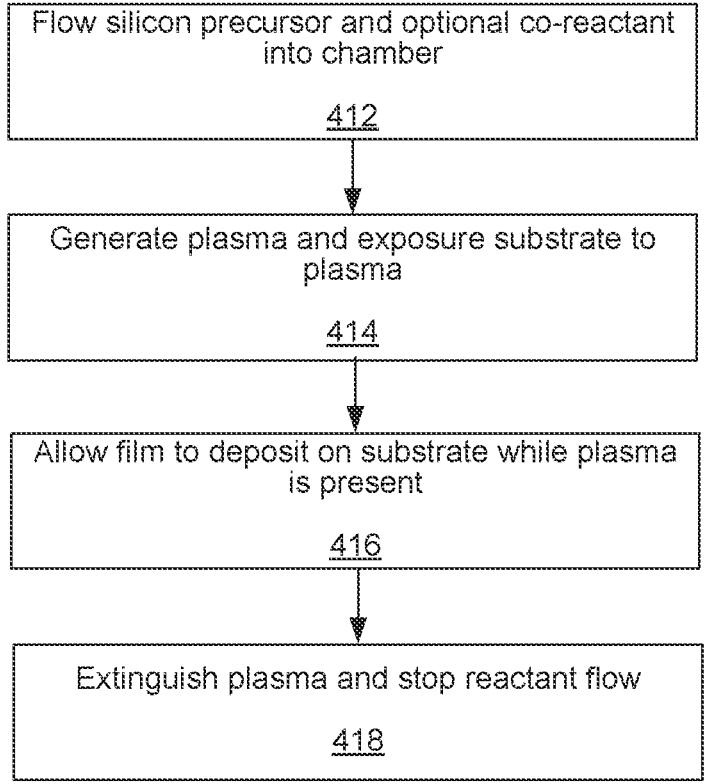

FIG. 4A presents a process flow diagram for a single plasma enhanced ALD cycle that may be implemented as part of operation 103 to deposit a protective liner or for any of the other ALD operations shown in FIG. 3. In an operation 402, the substrate is exposed to a silicon-containing precursor, to adsorb the precursor onto the surface of the feature. This operation may be self-limiting. In some embodiments, the precursor adsorbs to less than all the active sites on the surface of the feature. In an operation 404, the process chamber is optionally purged to remove any unadsorbed silicon-containing precursors. In an operation 406, the substrate is exposed to a plasma generated from a co-reactant. Examples include $O_2$ and/or $N_2O$ to form a silicon oxide layer or silicon oxynitride layer, $N_2$ or $NH_3$ to form a silicon nitride layer, methane ($CH_4$) to generate a silicon carbide layer etc. In operation 408, the process chamber is optionally purged to remove byproducts from the reaction between the silicon-containing precursor and the oxidant. Operations 402 through 408 repeated for a number of cycles to deposit the silicon-containing layer to a desired thickness in the feature.

It should be noted that the processes described herein are not limited to a particular reaction mechanism. Thus, the process described with respect to FIG. 3 includes all deposition processes that use sequential exposures to silicon-containing reactants and conversion plasmas, including those that are not strictly self-limiting. The process includes sequences in which one or more gases used to generate a plasma is continuously flowed throughout the process with intermittent plasma ignitions.

For depositing a silicon-containing protective liner, one or more silicon-containing precursors may be used. Silicon-containing precursors suitable for use in accordance with disclosed embodiments include polysilanes ($H_3Si$—($SiH_2$)$_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)_3$)). In some embodiments, an aminosilane that has two or more amine groups attached to the central Si atom may be used. These may result in less damage than aminosilanes having only a single amine group attached.

Further examples of silicon-containing precursors include trimethylsilane (3MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyl-diethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

As indicated above, an ALD process may be used to deposit a protective liner selectively at the top of the structure as well as fill a feature in a bottom-up process. For operation 103, the ALD is designed to deposit only at the top of the structure. This can be done by tailoring the dose and RF power to control the deposition into the feature. For a high AR structure, for example, a very short silicon precursor dose (during operation 402) and short RF on (during operation 406) can be used to deposit only near the top of the structure as shown in FIG. 2.

The same or different silicon precursor may be used for the protective liner as for subsequent gapfill. And as indicated, in many embodiments, the silicon dose time and plasma exposure time will be shorter for the protective liner deposition than for gap fill. However, if the silicon (or other precursor) dose should be long enough and the RF power and duration long enough that the film quality is good enough that the protective liner does not etch too quickly. FIG. 4A provides an example of ALD deposition for a silicon-containing film. As described above, other films may be used for the protective liner, using an appropriate precursor.

As discussed above, thickness of the protective liner depends on the etching component of the inhibition plasma operations. This can depend on plasma power, plasma duration, and temperature.

In some embodiments, a protective liner is deposited by plasma enhanced chemical vapor deposition (PECVD). PECVD can be advantageous to deposit selectively at the top of a feature. In a PECVD reaction, a substrate is exposed to one or more volatile precursors, which react and/or decompose to produce the desired film on the substrate surface. FIG. 4B shows a flow chart for a method of depositing a non-conformal protective liner by PECVD. The PECVD method generally begins by flowing one or more reactants—in the example of forming a silicon-containing film, a silicon precursor and an optional co-reactant—into the reaction chamber at operation 412. The reactant delivery may continue as plasma is generated in operation 414. The substrate surface is exposed to plasma, which causes deposition to occur on the substrate surface in operation 416. This process continues until a desired film thickness is reached. At operation 418, the plasma is extinguished, and the reactant flow is terminated. The reaction chamber may be optionally purged at that point. The reactants listed above may be used for PECVD.

In some embodiments, a relatively low quality silicon-containing layer may be deposited as the protective liner. For example, silane and methane may be used in a PECVD method to deposit silicon carbide selectively at the top of a gap. During gap fill, an aminosilane may be used for a higher quality film. Silane may be used for deposition of other relatively low quality silicon-containing films for the sacrificial protective liner.

Another aspect of the disclosure relates to improving seam quality. During gap fill, a seam may develop at the center axis of a feature as film grows from the sidewalls in. For example, referring to FIG. 3, while each inhibition block fills a portion of a gap in a bottom up manner, the growth during an inhibition block can proceed from the sidewalls of that portion, resulting in a center seam where growth from each sidewall meets.

Figure 5:
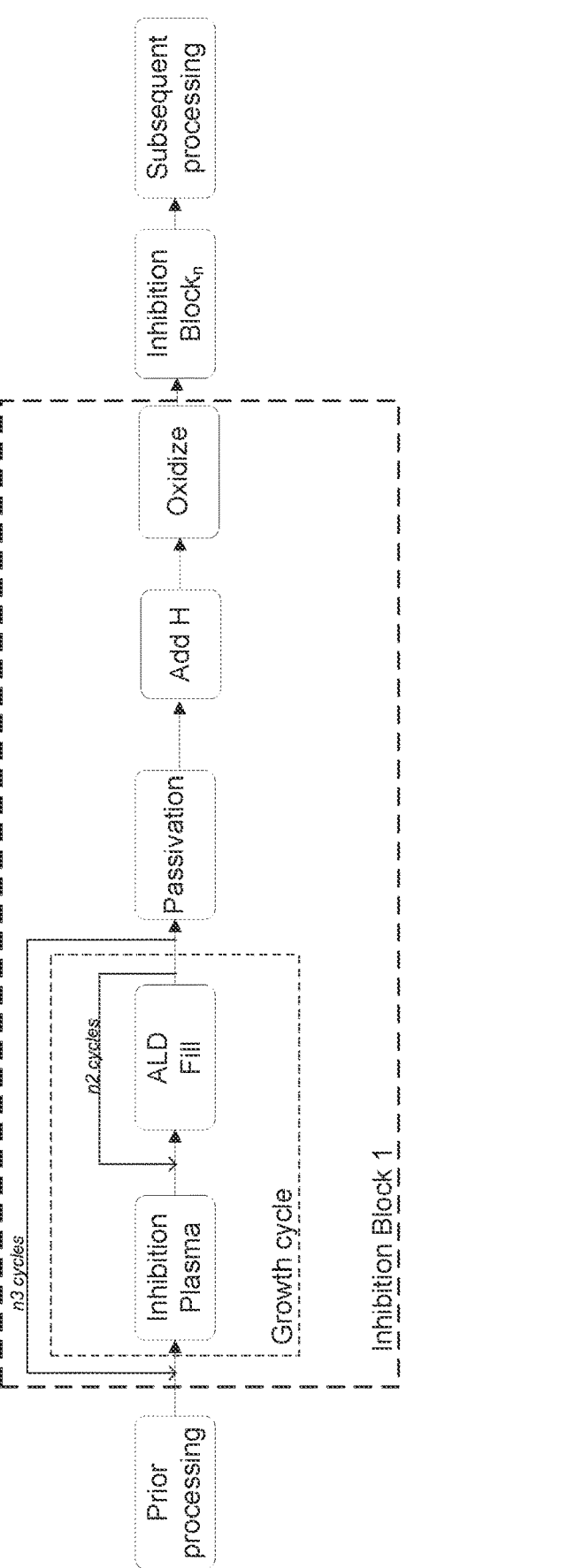
FIG. 5 shows an example of a process sequence that may be used in accordance with the disclosed embodiments.

Provided herein are methods of improving seam quality and that may be implemented as part of an ALD gap fill process. In some embodiments, they involve introducing hydrogen into a film (e.g., by exposing the film to a plasma generated from a process gas including $H_2$) during seam development. A subsequent treatment may then be used to react Si—H groups, for example, to form Si—O—Si linkages across the seam. In this manner, seams are reduced or prevented. FIG. 5 shows an example of a process sequence in which such a treatment is performed in an inhibition block sequence. The inhibition block shown in FIG. 5 includes adding hydrogen at the near the end of the inhibition block. In some embodiments, the film is exposed to a plasma generated from an H-containing gas. In some embodiments, it exposed to a hydrogen-containing oxidizing chemistry such has a plasma generated from $H_2/O_2$. This is followed by oxidation, e.g., from exposing the film to a plasma generated from $O_2$ with hydrogen.

Figure 6:
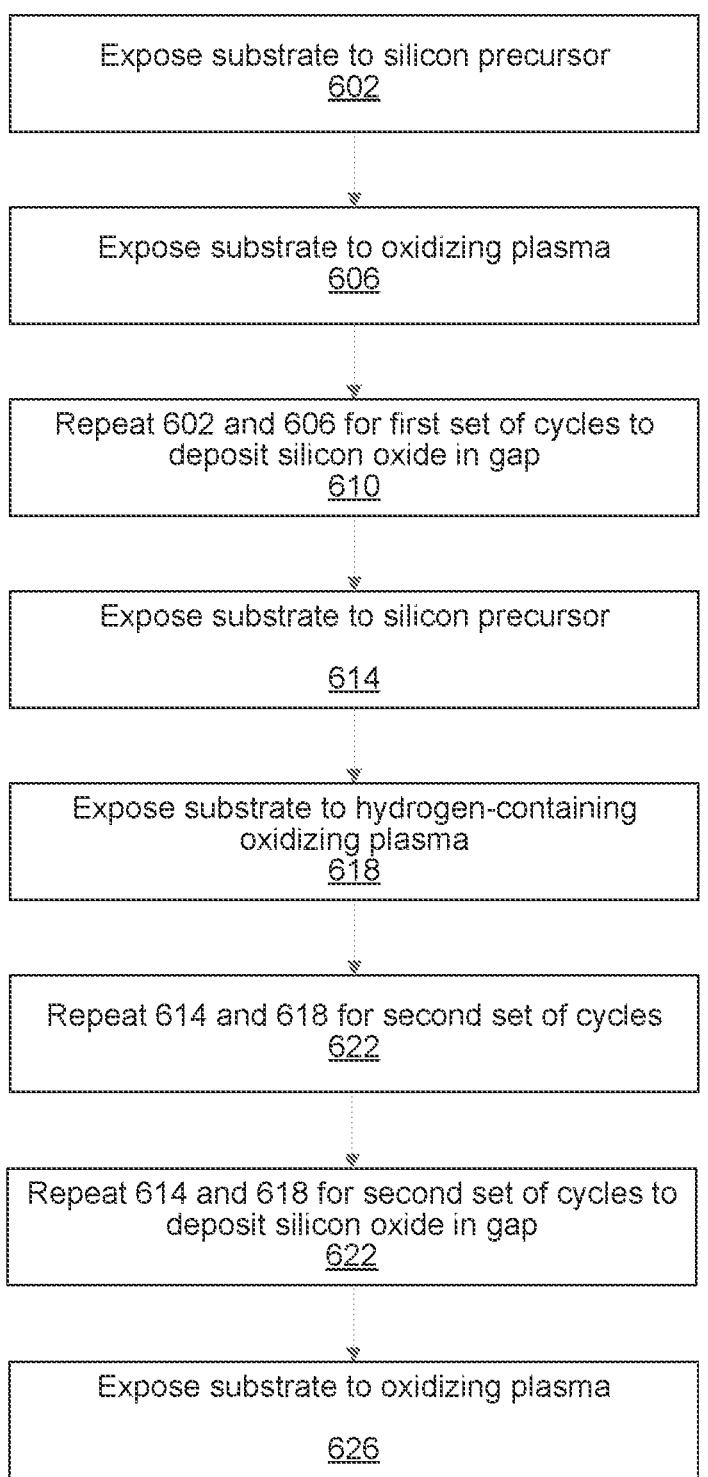
FIG. 6 is a process flow diagram depicting operations for a method in accordance with disclosed embodiments.

In another embodiment, hydrogen may be added to co-reactant doses during seam growth in an ALD process. An example is shown in FIG. 6, in which a silicon oxide film is formed by an ALD process. Blocks 602 and 606 may be performed in a manner as described above with respect to block 402 and 406 of FIG. 4A. In block 606, the substrate is exposed to an oxidizing plasma, e.g., generated from $O_2$ and/or $N_2O$. The blocks are repeated for a set of cycles to partially fill the gap with silicon oxide. (610). Blocks 614 and 618 may be performed in a manner as described above with respect to block 402 and 406, with a hydrogen-containing oxidizing plasma in block 618. These blocks are repeated for a set of cycles at the end of the ALD process during seam formation. (622). Then the substrate is exposed to an oxidizing plasma. (626).

The method in FIG. 6 may be implemented as part of an inhibition block. Referring to FIG. 3, hydrogen may be added to an oxidant co-reactant last x of the n3 growth cycles of an inhibition block as the seam begins to form. For example, if n3 is 30, an $O_2$ plasma may be used for the first 25 growth cycles and a $H_2/O_2$ may be added to the last 5 growth cycles. The passivation plasma may then serve as the oxidizing plasma in some embodiments.

A hydrogen-containing oxide chemistry may include hydrogen and oxygen, and potentially an inert gas. In some embodiments the oxide chemistry may also include nitrous oxide, carbon dioxide, or water. Other oxidants such as carbon monoxide, nitric oxide, nitrogen dioxide, sulfur oxide, sulfur dioxide, and oxygen containing hydrocarbons may be used in addition to or instead of nitrous oxide, carbon dioxide, and water.

The ratio of hydrogen to oxygen in the oxidization chemistry gas flow may be between about 1:10 to 1:1 $H_2:O_2$. In some embodiments gas flows may be 5 slm $H_2$, 5 slm $O_2$, and 5 slm $N_2O$. Too much hydrogen may cause exothermic, explosive reactions.

In various embodiments, the plasma is an in-situ plasma, such that the plasma is formed directly above the substrate surface in the station. Example power per substrate areas for an in-situ plasma are between about 0.2122 $W/cm^2$ and about 2.122 $W/cm^2$ in some embodiments. For example, the power may range from about 600 W to about 6000 W for a chamber processing four 300 mm wafers. Plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that second reactant is ignited in a remote plasma generator upstream of the station, then delivered to the station where the substrate is housed.

Apparatus

Figure 7:
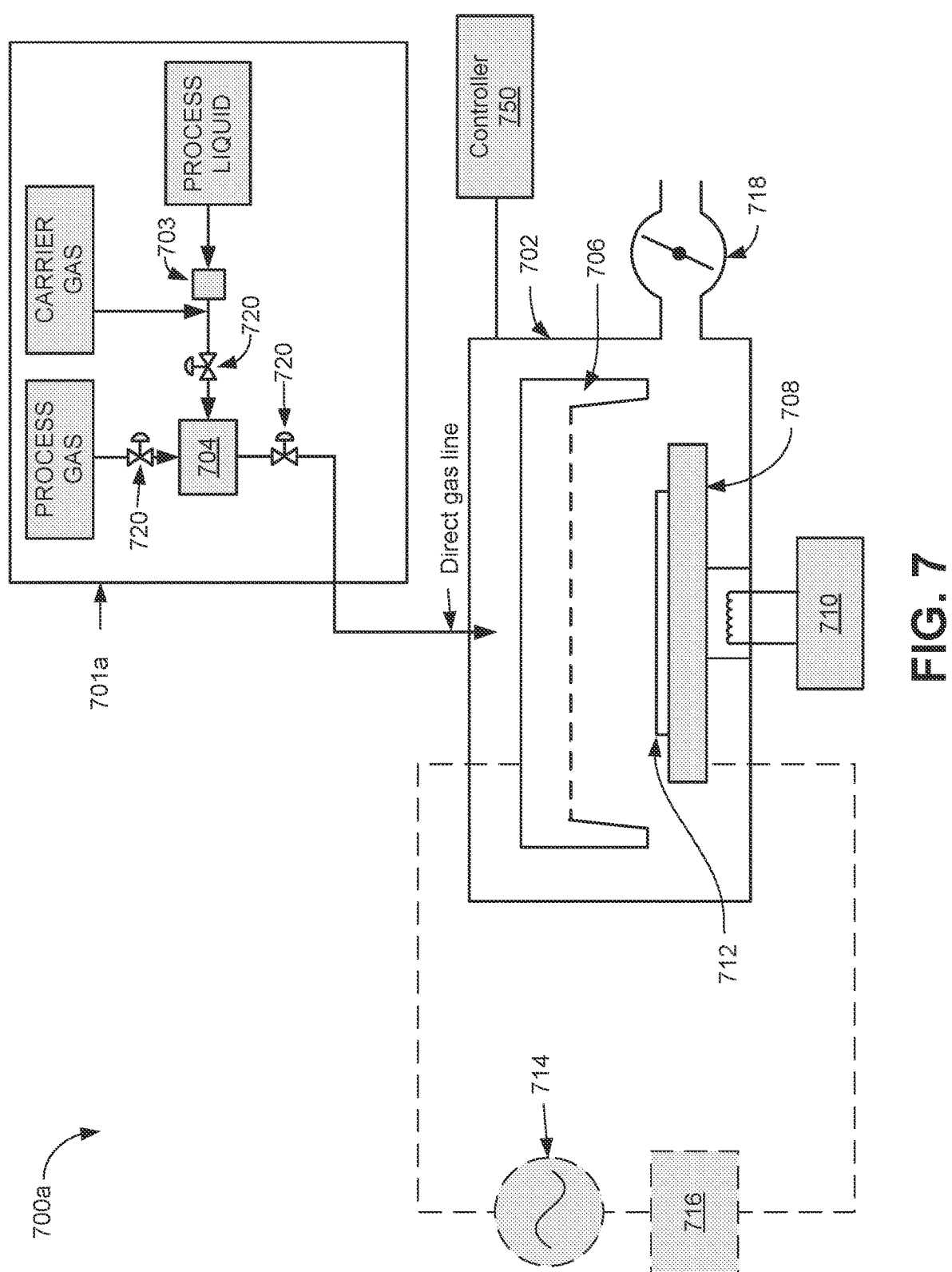
FIG. 7 is a schematic diagram of an example process station for performing disclosed embodiments.

FIG. 7 depicts a schematic illustration of an embodiment of an atomic layer deposition (ALD) process station 700 having a process chamber body 702 for maintaining a low-pressure environment. A plurality of ALD process stations 700 may be included in a common low-pressure process tool environment. For example, FIG. 7 depicts an embodiment of a multi-station processing tool 700. In some embodiments, one or more hardware parameters of ALD process station 700, including those discussed in detail below, may be adjusted programmatically by one or more system controllers 750.

ALD process station 700 fluidly communicates with reactant delivery system 701a for delivering process gases to a distribution showerhead 706. Reactant delivery system 701a includes a mixing vessel 704 for blending and/or conditioning process gases for delivery to showerhead 706. In some embodiments, an inhibitor gas may be introduced to the mixing vessel prior to introduction to the chamber body 702, such as if provided with a carrier gas. In some embodiments, an inhibitor or other gas may be directly delivered to the chamber body 702. One or more mixing vessel inlet valves 720 may control introduction of process gases to mixing vessel 704. These valves may be controlled depending on whether a process gas, inhibitor gas, or carrier gas may be turned on during various operations. In some embodiments, an inhibitor gas may be generated by using an inhibitor liquid and vaporizing using a heated vaporizer.

As an example, the embodiment of FIG. 7 includes a vaporization point 703 for vaporizing liquid reactant to be supplied to the mixing vessel 704. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/ or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, liquid precursor or liquid reactant, such as a silicon-containing precursor, may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) (not shown) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes gases toward substrate 712. For example, showerhead 706 may distribute an inhibitor gas to the substrate 712, silicon-containing precursor gas to the substrate 712, or a purge or carrier gas to the chamber body 702, a second reactant to the substrate 712, or a passivation gas to the substrate 712, in various operations. In the embodiment shown in FIG. 7, the substrate 712 is located beneath showerhead 706 and is shown resting on a pedestal 708. Showerhead 706 may have any suitable shape and may have any suitable number and arrangement of ports for distributing process gases to substrate 712.

In some embodiments, a microvolume is located beneath showerhead 706. Practicing disclosed embodiments in a microvolume rather than in the entire volume of a process station may reduce reactant exposure and purge times, may reduce times for altering process conditions (e.g., pressure, temperature, etc.) may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 708 may be raised or lowered to expose substrate 712 to microvolume 707 and/or to vary a volume of microvolume 707. For example, in a substrate transfer phase, pedestal 708 may be raised to position substrate 712 within microvolume 707. In some embodiments, microvolume 707 may completely enclose substrate 712 as well as a portion of pedestal 708 to create a region of high flow impedance.

Optionally, pedestal 708 may be lowered and/or raised during portions the process to modulate process pressure, reactant concentration, etc., within microvolume 707. In one scenario where process chamber body 702 remains at a base pressure during the process, lowering pedestal 708 may allow microvolume 407 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 750.

In another scenario, adjusting a height of pedestal 708 may allow a plasma density to be varied during optional plasma activation processes. For example, the plasma may be activated when the inhibitor gas is introduced to the chamber body 702, or when the second reactant is flowed to the chamber body 702. In some embodiments, a plasma may not be activated during flow of the inhibitor gas or the flow of the second reactant. At the conclusion of the process phase, pedestal 708 may be lowered during another substrate transfer phase to allow removal of substrate 712 from pedestal 708.

While the example microvolume variations described herein refer to a height-adjustable pedestal 708, it will be appreciated that, in some embodiments, a position of showerhead 706 may be adjusted relative to pedestal 708 to vary a volume of microvolume 707. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable controllers 750.

Showerhead 706 and pedestal 708 electrically communicate with a radio frequency (RF) power supply 714 and matching network 716 for powering a plasma. In some embodiments, the plasma energy may be controlled by controlling one or more of a process station pressure, gas concentrations and partial pressures of gases or gas flow rates, an RF source power, an RF source frequency, and a plasma power pulse timing. For example, RF power supply 714 and matching network 716 may be operated at any suitable power to form a plasma having a desired composition of radical species. Examples of suitable powers are included above. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as disilane), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert, inhibitor and/or reactant gas which may be the same as or different from the gas used in the first recipe phase (e.g., a hydrogen-containing inhibitor), instructions for modulating a flow rate of a carrier gas, and time delay instructions for the third recipe phase. A fourth recipe phase may include instructions for modulating or stopping a flow rate of an inert and/or a reactant gas (e.g., a second reactant such as nitrogen or a nitrogen-containing or oxygen-containing gas), instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 708 may be temperature controlled via heater 710. Further, in some embodiments, pressure control for process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to the process station 700.

Figure 8:
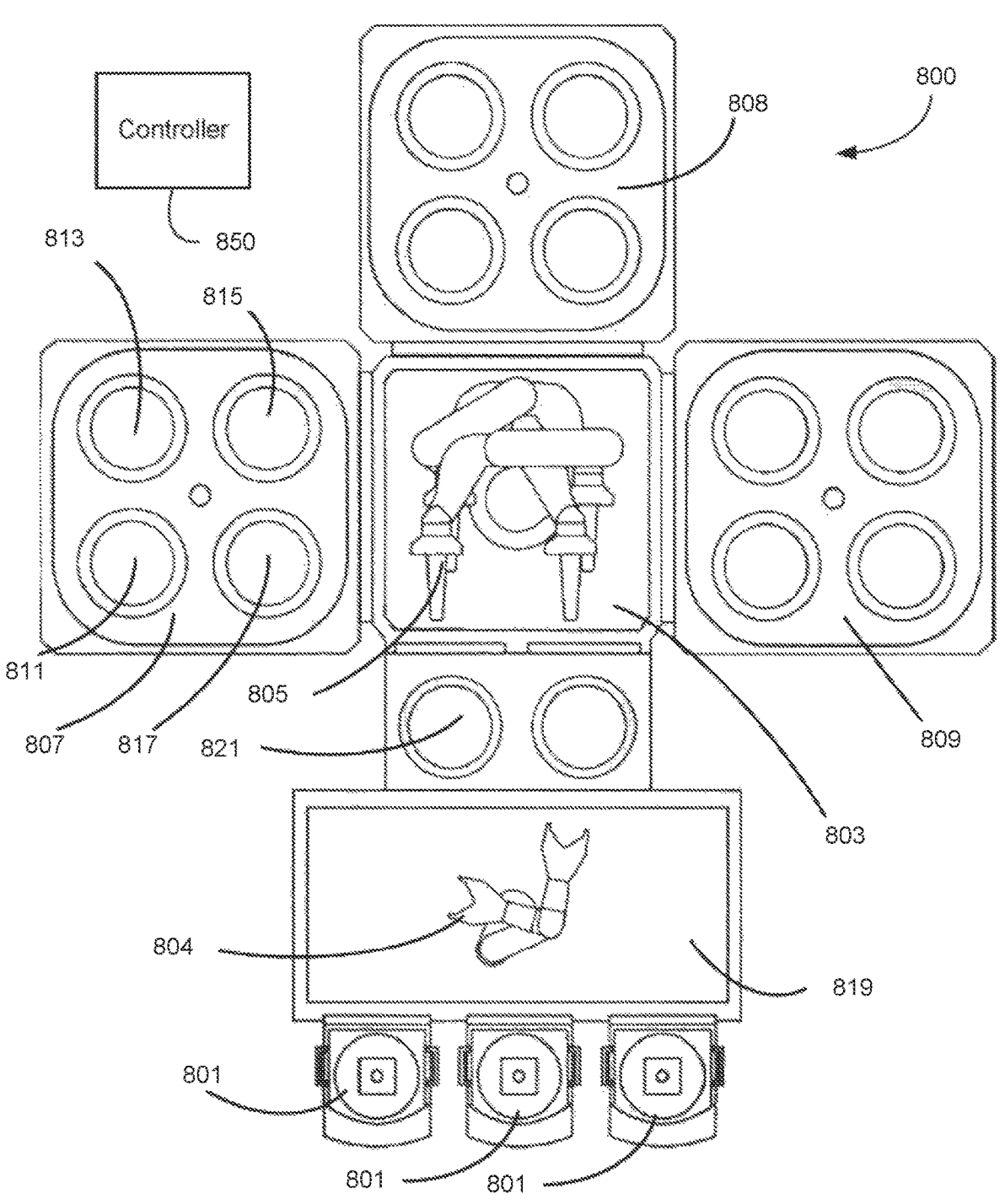
FIG. 8 is a schematic diagram of an example process tool for performing disclosed embodiments.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source. A robot 806, at atmospheric pressure, is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to a remote plasma treatment in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc.

In some embodiments, system controller 850 controls all the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., silicon-containing precursor, co-reactant, inhibition, passivation, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases and/or inhibitor gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. The parameters may be specific to the type of process to be performed and the type of tool that the system controller 550 is configured to interface with or control. Thus, as described above, the system controller 550 may be distributed, such as by including one or more discrete controllers that are networked together and working towards a common purpose, such as the processes and controls described herein. An example of a distributed controller for such purposes may be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   providing a substrate having structure including a gap to be filled;
   depositing a protective liner selectively at an upper portion of the structure such that it extends only partially into the gap, wherein the structure is a 3D NAND structure and the gap is formed by two stacks of the 3D NAND structure, each stack comprising multiple pairs of an oxide layer and a nitride layer and capped by a polysilicon layer, and wherein the protective liner protects the polysilicon layer; and
   performing one or more cycles of:
   (a) exposing the substrate to a plasma comprising halogen species to inhibit deposition on a portion of the gap;
   (b) after (a), depositing dielectric material in the gap.

2. The method of claim 1, wherein the protective liner is a silicon-containing film.

3. The method of claim 1, wherein the protective liner is an oxide, nitride, or carbide.

4. The method of claim 1, wherein the protective liner is etched during (a).

5. The method of claim 1, wherein the plasma during (a) is generated from nitrogen trifluoride ($NF_3$) and the protective liner is a silicon nitride film.

6. The method of claim 1, wherein the protective liner is between 10 and 999 Angstroms thick.

7. The method of claim 1, wherein depositing a protective liner and the performing one or more cycles are performed in the same chamber.

8. The method of claim 1, wherein depositing the protective liner comprises a plasma enhanced atomic layer deposition (ALD) process.

9. The method of claim 8, wherein plasma power during the ALD process is lower than plasma power during (a).

10. The method of claim 1, wherein depositing the protective liner comprises a plasma enhanced chemical vapor deposition (PECVD) process.

11. The method of claim 10, wherein the protective liner is a silicon carbide liner deposited from silane.

12. The method of claim 1, wherein the protective liner is silicon nitride and the dielectric material is silicon-containing.

13. A method comprising:

providing a substrate having structure including a gap to be filled, the gap lined with a protective liner that extends only partially into the gap; and performing one or more cycles of:
(a) exposing the substrate to a plasma comprising halogen species to inhibit deposition on a portion of the gap;
(b) after (a), depositing dielectric material in the gap;
and further comprising depositing a second protective liner that extends only partially into the gap during the one or more cycles.

14. The method of claim 13, wherein the plasma during (a) is generated from nitrogen trifluoride ($NF_3$) and the protective liner is a silicon nitride film.

15. The method of claim 13, wherein the plasma during (a) is generated from nitrogen trifluoride ($NF_3$) and the protective liner is a silicon carbide film.

16. The method of claim 13, wherein the protective liner is silicon nitride and the dielectric material is silicon-containing.

\* \* \* \* \*